United States Patent
Kempe et al.

(10) Patent No.: US 8,389,893 B2
(45) Date of Patent: Mar. 5, 2013

(54) LASER BEAM MACHINING

(75) Inventors: Michael Kempe, Jena (DE); Peter Westphal, Jena (DE); Wolfgang Grau, Jena (DE); Georg von Freymann, Eggenstein-Leopoldshafen (DE)

(73) Assignee: Nanoscribe GmbH, Eggenstein-Leopoldshafen (DE)

( * ) Notice: Subject to any disclaimer, the term of this patent is extended or adjusted under 35 U.S.C. 154(b) by 88 days.

(21) Appl. No.: 12/744,216

(22) PCT Filed: Nov. 20, 2008

(86) PCT No.: PCT/EP2008/009840
§ 371 (c)(1),
(2), (4) Date: Aug. 11, 2010

(87) PCT Pub. No.: WO2009/065590
PCT Pub. Date: May 28, 2009

(65) Prior Publication Data
US 2010/0294749 A1  Nov. 25, 2010

(30) Foreign Application Priority Data

Nov. 21, 2007 (DE) .......................... 10 2007 055 530

(51) Int. Cl.
*B23K 26/00* (2006.01)
*B23K 26/14* (2006.01)
*B23K 26/16* (2006.01)
*B23K 26/06* (2006.01)
*B23K 26/02* (2006.01)
*B23K 26/08* (2006.01)
*G02B 21/00* (2006.01)

(52) U.S. Cl. ......... 219/121.72; 219/121.67; 219/121.75; 219/121.76; 219/121.77; 219/121.78; 219/121.79; 219/121.8; 219/121.81; 359/368

(58) Field of Classification Search ............. 219/121.67, 219/121.72, 121.76, 121.77, 121.78, 121.79, 219/121.8, 121.81, 121.75; 359/368
See application file for complete search history.

(56) References Cited

U.S. PATENT DOCUMENTS
(Continued)

FOREIGN PATENT DOCUMENTS
DE   195 37 376 A1   4/1996
DE   101 12 639 A1   9/2002
(Continued)

OTHER PUBLICATIONS

Lourtioz, Jean-Michel, "Writing 3D photonic structures with light," *Nature Materials*, vol. 3, pp. 427-428 (Jul. 2004).

(Continued)

*Primary Examiner* — Ida M Soward
(74) *Attorney, Agent, or Firm* — Patterson Thuente Christensen Pedersen, P.A.

(57) ABSTRACT

A method for laser beam machining of a workpiece in which a laser beam is focused by an objective, into or onto the workpiece having a boundary surface, to produce a machining effect by a two-photon process, and the position of the focal point with respect to the workpiece is shifted. To obtain a reference for the position of the focal point, an image of a luminating modulation object is projected through the objective onto the workpiece into the focal plane or so as to intersect it. Reflections of the image occurring at the boundary surface are imaged into an autofocus image plane, and are detected by a camera. The camera image plane either intersects the autofocus image plane when the image of the illuminating modulation object lies in the focal plane, or lies in the autofocus image plane when the image of the modulation object intersects the focal plane.

25 Claims, 8 Drawing Sheets

U.S. PATENT DOCUMENTS

| | | | |
|---|---|---|---|
| 4,958,920 A * | 9/1990 | Jorgens et al. | 359/392 |
| 5,034,613 A | 7/1991 | Denk et al. | |
| 5,434,632 A * | 7/1995 | Carmichael | 353/101 |
| 5,469,259 A * | 11/1995 | Golby et al. | 356/495 |
| 5,495,279 A | 2/1996 | Sandstrom | |
| 5,579,156 A * | 11/1996 | Faltermeier et al. | 359/363 |
| 5,604,344 A | 2/1997 | Finarov | |
| 5,798,927 A * | 8/1998 | Cutler et al. | 700/188 |
| 5,986,781 A * | 11/1999 | Long | 359/30 |
| 6,094,300 A * | 7/2000 | Kashima et al. | 359/385 |
| 6,248,988 B1 * | 6/2001 | Krantz | 250/201.3 |
| 6,410,213 B1 | 6/2002 | Raguin et al. | |
| 6,545,756 B1 | 4/2003 | Ganeev et al. | |
| 6,640,014 B1 | 10/2003 | Price et al. | |
| 6,720,522 B2 * | 4/2004 | Ikegami et al. | 219/121.69 |
| 7,366,378 B2 * | 4/2008 | Jia et al. | 385/37 |
| 7,601,938 B2 * | 10/2009 | Cartlidge et al. | 250/208.1 |
| 7,633,041 B2 * | 12/2009 | Furman et al. | 250/201.2 |
| 7,725,169 B2 * | 5/2010 | Boppart et al. | 600/473 |
| 7,756,305 B2 * | 7/2010 | Price | 382/128 |
| 7,831,106 B2 * | 11/2010 | Elsner et al. | 382/254 |
| 8,143,552 B2 * | 3/2012 | Nomaru | 219/121.67 |
| 2004/0021936 A1 | 2/2004 | Czarnetzki et al. | |
| 2004/0129858 A1 | 7/2004 | Czarnetzki et al. | |
| 2004/0207811 A1 * | 10/2004 | Elsner | 351/205 |
| 2006/0166469 A1 * | 7/2006 | Nakayama et al. | 438/487 |
| 2007/0102620 A1 | 5/2007 | Bublitz et al. | |
| 2007/0215581 A1 * | 9/2007 | Kato et al. | 219/121.69 |
| 2008/0266655 A1 * | 10/2008 | Levoy et al. | 359/368 |
| 2009/0180360 A1 * | 7/2009 | Noehte et al. | 369/13.02 |
| 2010/0033811 A1 * | 2/2010 | Westphal et al. | 359/368 |
| 2010/0128221 A1 * | 5/2010 | Muller et al. | 351/207 |
| 2010/0142014 A1 * | 6/2010 | Rosen et al. | 359/1 |

FOREIGN PATENT DOCUMENTS

| | | |
|---|---|---|
| DE | 101 27 284 A1 | 12/2002 |
| DE | 690 32 621 T3 | 8/2004 |
| DE | 690 34 117 T2 | 8/2004 |
| DE | 103 19 182 A1 | 12/2004 |
| DE | 10 2006 027 836 A1 | 12/2007 |
| EP | 0 558 781 A1 | 9/1993 |
| JP | 2006305608 A * | 11/2006 |
| JP | 2007014990 A * | 1/2007 |
| JP | 2007296533 A * | 11/2007 |
| WO | WO 99/64929 | 12/1999 |
| WO | WO 00/43820 | 7/2000 |
| WO | WO 03/060610 A1 | 7/2003 |
| WO | WO 2007/019894 A1 | 2/2007 |
| WO | WO 2007/144197 A1 | 12/2007 |

OTHER PUBLICATIONS

Deubel, Markus, et al., "Direct laser writing of three-dimensional photonic-crystal templates for telecommunications," *Nature Materials*, vol. 3, pp. 444-447 (Jul. 2004).

Whiting, Andrew I., "Polarization-Assisted Transverse and Axial Optical Superresolution," *Optics Express*, vol. 11, No. 15, pp. 1714-1723 (Jul. 2003).

Dorn, R., et al., "Sharper Focus for a Radially Polarized Light Beam," *Physical Review Letters*, vol. 91, No. 23, pp. 233901-1-233901-4 (Dec. 2003).

Marsh, P.N., et al., "Practical implementation of adaptive optics in multiphoton microscopy," *Optics Express*, vol. 11, No. 10, pp. 1123-1130 (May 2003).

Miller, Jordan S., et al., "Laser-Scanning Lithography (LSL) for the Soft Lithographic Patterning of Cell-Adhesive Self-Assembled Monolayers," *Biotechnology and Bioengineering*, vol. 93, No. 6, Apr. 20, 2006, pp. 1060-1068.

* cited by examiner

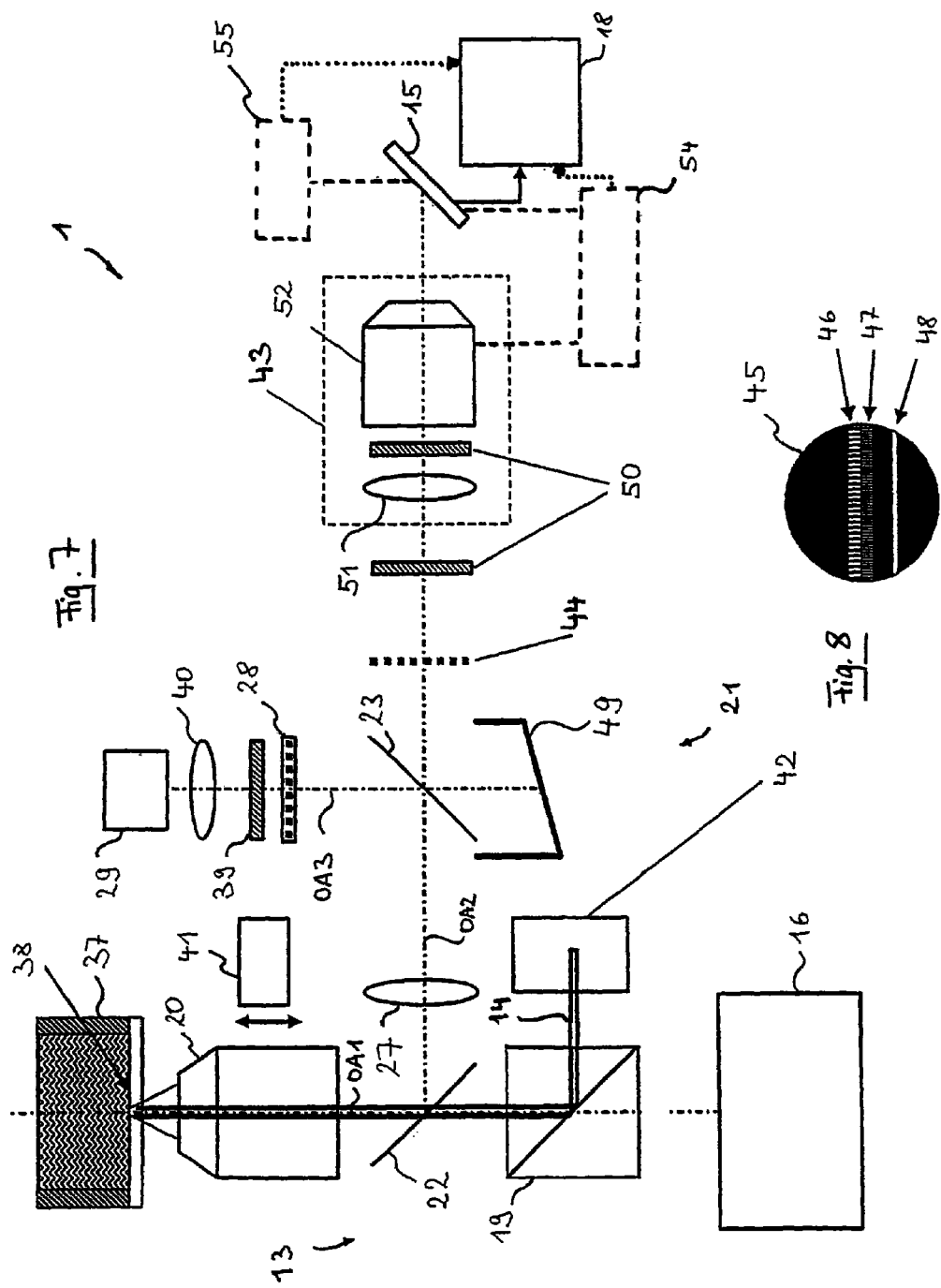

LASER BEAM MACHINING

PRIORITY CLAIM

The present application is a National Phase entry of PCT Application No. PCT/EP2008/009840, filed Nov. 20, 2008, which claims priority from German Application Number 102007055530.1, filed Nov. 21, 2007, the disclosures of which are hereby incorporated by reference herein in their entirety.

FIELD OF THE INVENTION

The invention relates to an apparatus and a method for laser machining a workpiece by two-photon processes.

BACKGROUND

Laser beam machining of a workpiece by two-photon processes usually occurs by shifting a laser beam focus over or in the workpiece and is also known as laser writing or laser scanning lithography. Apparatuses and methods for this purpose are known from the state of the art and usually utilize the polymerization of a workpiece, e.g. of a photosensitive resist. A respective description can be found in J.-M. Lourtioz, Nature Materials 3, 427 (2004) and M. Deubel et al., Nature Materials 3, 444 (2004). A microscope for laser beam writing has been described for example in U.S. Pat. No. 5,034,613. Materials suitable for laser beam writing have been explained for example in the publication Miller J. et al., "Laser-Scanning Lithography (LSL) for the Soft Lithographic Patterning of Cell-Adhesive Self-Assembled Monolayers", in Biotechnology and Bioengineering, Vol. 93, No. 6, Apr. 20, 2006, pages 1060-1068.

The goal thereby is to achieve a very high resolution, which is why objectives of high numerical aperture are used in order to advance into a range of less than 100 nm with the machining precision. Generally, oil immersion lenses having a numerical aperture of approx. 1.4 are used. The structures to be written into the workpiece themselves usually extend a few 100 μm in all directions of space. Photosensitive lacquers (resists) are used among others as suitable workpiece materials which resists are spin-coated on a cover glass.

The reproduction of the short-range order and long-range order and a precise reference to at least one boundary surface are relevant for the quality of the structuring, in addition to the resolution. For scanning, which means for shifting the focus position in or on the workpiece, mostly highly precise piezo tables are therefore used for moving the workpiece. It needs to be ensured however that the position of the sample remains as stable as possible during a possibly long writing/exposure process both transversally to the optical axis (therefore laterally) and longitudinally thereto (therefore axially). This is essential for machining the workpiece in certain production processes, as also the absolute referencing of the focus position.

The problem arises however that the referencing of the absolute position of the focus is often very difficult or even impossible, and can especially change during the machining process.

It is further known in the state of the art to use triangulation methods, imaging methods with contrast evaluation and the determination of positions by means of obliquely positioned confocal slit diaphragm for autofocus functions. In the case of triangulation methods, a collimated laser beam is reflected into the pupil plane of a lens and conclusions are drawn on the z-position of the laser light reflected from the sample from the progression of this laser beam relative to the imaging beam path. In the case of conventional sizes of workpieces which are machined with laser scanning lithography, the autofocus quality of such systems would be insufficient. Moreover, fluctuations can be determined as to whether the result of the measurement is made at the center or the edge of the workpiece or of the detector employed for this purpose. A triangulation method is therefore usually performed iteratively, which is relatively time-consuming.

In the case of imaging methods with contrast evaluation, a sample is illuminated with a specific intensity distribution, generally in that a grating is placed in a field stop plane of an illumination beam path. A series of pictures is taken with different distances between imaging optics and sample and the picture with the highest contrast in this series, is determined to which picture the optimal focal distance is assigned. Examples for an autofocus device by means of contrast analysis of a pattern projected to a sample can be found in U.S. Pat. No. 5,604,344 or U.S. Pat. No. 6,545,756.

The fact that workpieces machined by means of two-photon processes are usually transparent represents a problem here because there are no structures in the workpiece as a result of its transparency.

It is further known from DE 10319182 A1 for example to provide the determination of position by means of an obliquely positioned confocal slit diaphragm, in that a slit diaphragm is positioned in a field stop plane of the illumination beam path and is projected to a sample. The light reflected from the sample is directed to a CCD line which is arranged in an inclined manner relative to the slit diaphragm and the position on the CCD line is determined where the reflected light has a maximum. This method is very quick, but has problems with impurities on the sample or the sample surface which can lead to fluctuations in intensity. Moreover, it is necessary to apply a high amount of adjustment in the projection of the gap onto the CCD line, because the gap needs to be very narrow in order to enable the achievement of high precision. In particular, the slit diaphragm is effective at the edge of the picture field of the lens, which considerably limits the precision. This approach can therefore not be used for laser scanning lithography.

All methods have in common that they are capable of finding the focal plane very precisely, but are able to determine the position of this focal plane within the sample in a very limited way, especially concerning further boundary surfaces.

The use of several autofocus beam paths is described for example in WO 00/43820.

SUMMARY OF THE INVENTION

The invention is therefore based on the object of providing a method and an apparatus with which laser beam machining of transparent workpieces is possible by means of two-photon processes in a highly precise manner.

In order to achieve this object, a method for laser beam machining of a workpiece is provided in accordance with the invention, wherein a laser beam is focused by an objective, which has a focal plane, into or onto the workpiece, having a boundary surface, to produce a machining effect by means of two-photon processes, and the position of the focal point with respect to the workpiece is shifted, and in order to obtain a reference for the position of the focal point an image of a luminating modulation object is projected likewise through the objective to the workpiece and into the focal plane or so as to intersect it, and reflections of the projection occurring at the boundary surface are imaged into an autofocus image plane, and are detected by a camera having a camera image plane, wherein the camera image plane either intersects the autofocus image plane when the projection of the illuminating modulation object lies in the focal plane, or lies in the autofocus image plane when the projection of the modulation object intersects the focal plane.

The invention further achieves the object with a microscope for laser machining a workpiece by means of two-photon processes, which comprises the following: an objective which has a focal plane disposed in a receiving space for the workpiece, a machining laser beam source which emits machining laser radiation which the objective focuses in the receiving space for the workpiece, and an autofocus device which comprises a light modulator for generating a luminating, intensity-modulated modulation object, autofocus optics which in combination with the lens projects the luminating modulation object into the focal plane or intersects the same so that an image of the modulation object is produced in the receiving space for the workpiece, a camera for taking a two-dimensional picture which has a camera image plane, and autofocus imaging optics which together with the objective project the image of the modulation object disposed in the receiving space for the workpiece either to the autofocus image plane, wherein the camera image plane intersects the autofocus image plane when the image of the illuminating modulation object lies in the focal plane, or lies in the autofocus image plane when the image of the modulation object intersects the focal plane.

This object is achieved by the invention in such a way that an autofocus function is used which allows targeting to the boundary surface of the workpiece with high precision, with an independent autofocus projection of a luminating modulation object being used which is projected either in an oblique manner into the boundary surface or whose projection in relation to the boundary surface is detected in an oblique manner.

In the case of a specularly reflected boundary surface (as is present for example between a cover glass and a resist for example), a contrast signal will also be produced on an oblique autofocus detector when the grating is projected many depths of focus before or behind the boundary surface. As a result, a relatively large catch range is obtained in this autofocus principle.

As a result of the projection/detection of the luminating modulation object, a back reflection occurs where the projection/detection of the luminating modulation object intersects the boundary surface. This back reflection is now detected, so that the focusing or a degree of defocusing can be determined from the lateral position of the reflection. The thus known position of the boundary surface is now used for referencing in laser beam machining. As a result, the precise position of the focus in relation to the boundary surface is thus possible, e.g. a transition between cover glass and actual workpiece. If it can be expected that a drift occurs in the system during the laser machining, the referencing can be repeated in a suitable manner, e.g. intermittently, so that the same high precision is ensured even in the case of laser beam machining of any desired duration.

It is advantageous for optimal detection of the boundary surface, i.e. for an optimal autofocus function, to work in a spectral range in which is without the one of the machining laser beam. It is therefore preferable that the modulation object emits light in a spectral range which differs from that of the laser beam and that the spectral range of the laser beam is filtered out in the detection of the reflections with the camera. This can be achieved by suitable filters in the detection beam path.

It is therefore preferable for a quality which is independent of the machining duration that the position of the boundary surface is determined during laser beam machining at least intermittently and is used as a reference for setting the position of the focus.

In order to increase the precision, the position of the boundary surface can be determined prior to the actual laser beam machining at different lateral points, i.e. in different positions in relation to the optical axis, and the surface can be modeled by a plane. The modeled plane is then a more precise indication of the position of the boundary surface.

Any deviation in the form of tilting which is the result from the perpendicular to the optical axis can then be considered in later laser beam machining. If it is recognized that individual or several lateral points have a very large deviation from the modeled plane, it is possible to conclude that there is a deformation of the boundary surface. Such a deformation is obviously a quality parameter of the workpiece. It is therefore preferable that a measure on the deviation of the boundary surface from an ideal plane is determined from the distances of the position of the lateral points from the modeled plane and that the workpiece is assigned a quality parameter which is based on the measure. In a specific quality parameter range it is possible to suppress further machining of the workpiece, e.g. because its boundary surface is deformed too strongly.

The machining of the workpiece usually occurs by three-dimensional focal adjustment. The workpiece or the focus can be moved alternately. The focus is preferably adjusted in planes which are each processed successively completely and which either lie parallel or perpendicular to the boundary surface, with one referencing each being made to the boundary surface for each plane or processing of each plane. This referencing can occur in such a way for example that a renewed determination of the position of the boundary surface, i.e. the reference, is made before accessing the next plane.

Preferably, the modulation contrast is generated from a static transmission or reflection grating. The modulation contrast can be arranged for example as a planar extending strip grating. The grating period is principally chosen to be as small as possible in order to achieve a high autofocus resolution. The grating period must be so large however that a modulation contrast of at least 10% is obtained on the autofocus camera for the entire required catch area. The limitations occur at the edge regions of the modulation object because the spherical aberrations are largest at the edges of the image field as a result of the oblique positioning of the autofocus camera. As a result, the grating period must be chosen to be clearly larger than the Abbé resolution of the used lens on the optical axis. In order to enable working with the largest variety of workpieces, it is preferable for the microscope in accordance with the invention that the light modulator can be controlled and is controlled for generating a spatially or temporally intensity-modulated modulation object and the camera detects the contrast in respect of this temporal modulation. The reflection evaluated for the position of the boundary surface can then be separated from possible background noise or interference signals by suitable temporal filtering, e.g. in lock-in technique. The light modulator preferably comprises an illuminated LCD or DMD element or at least one periodic structure, in particular a strip grating structure or several different strip structures.

The modulation object modulates spatially and can additionally modulate temporally when using an adjustable light modulator. Temporal modulation is an alternative to spectral separation in order to distinguish the illumination by the modulation object from the machining laser radiation. In this connection, the detection of the autofocus projection is preferably synchronized in relation to temporal modulation, a lock-in technique can be used for example. Preferably, the temporal modulation occurs with such a high frequency that it cannot be perceived during visual observation in the microscope, e.g. through a microscope eyepiece. A possible frequency range lies above the image fusion frequency of the eye, which is approx. 50 Hz in the bright-adapted state, e.g. between 50 and 200 Hz is a possible range.

An especially precise determination of the position of the boundary surface can be achieved because the projection of the object occurs via the same lens which also focuses the machining laser radiation into and/or onto the workpiece. It is preferable for a simple optical arrangement that the projection of the modulation object is reflected via a beam splitter into the beam path of the microscope.

A spectral separation is advantageous in addition or alternatively to the temporal discrimination of the projection, which has already been explained in the one but last paragraph. It is appropriately provided for the same that the light modulator emits light or is illuminated in an autofocus spectral range which differs from that of the machining laser radiation, and the autofocus projection optics comprise at least one filter which suppresses or filters out spectral ranges disposed outside of the autofocus spectral range, especially those of the machining laser radiation.

The coupling in and out of the structured illumination and the projection of the reflections on the workpiece to the camera can advantageously be made using a divider mirror which has an only low influence on the remaining microscope beam path, e.g. by a high degree of transmission for the machining radiation (approx. 95% or higher are possible). A dichroic separation in combination with spectral separated autofocus radiation is especially preferred. It is further advantageous to provide an anti-reflective coating on the splitter in order to influence the remaining microscope beam path as little possible. It is obviously also possible to increase the degree of reflectance at the expense of the degree of transmission. When the autofocus system works for example with an infrared (NIR) illumination source, the dichroic beam splitter is preferably arranged in such a way that it guides the autofocus radiation with high efficiency in the autofocus beam path, or couples in and out the same.

In a simplified configuration the illuminating modulation object can illuminate in a spectral range in which the machining laser radiation is also disposed as long as the autofocus projection optics suppress or filter out spectral ranges of the machining laser radiation.

Advantageously there is a periodic illumination of the modulation object, e.g. strip illumination, in which the modulation object is then a stripe pattern. A respective periodic pattern then appears on the camera, e.g. a strip pattern whose contrast is at a maximum in the plane conjugated to the current focal plane. A highly reliable and precise autofocus system for the boundary surfaces of the workpiece can thus be realized.

Both the light modulator and the autofocus camera are designed to be two-dimensional, i.e. in planar. Each line of the 2D resolving autofocus camera can be used for generating an autofocus signal. Since several lines are always illuminated, the autofocus signals of several lines can be averaged, which considerably improves the precision of the method.

The fewer disturbing background reflections there are, the wider the modulation object can extend. In principle, the complete object field can be illuminated with a grating structure, so that also the planar autofocus camera is utilized maximally. If there are disturbing competitive reflections, especially from the surface of the cover glass (towards the air) which is not adjacent to the resist, the modulation object needs to be designed to be narrow, so that a confocal suppression of the competitive reflections is achieved. In such a case, only very few lines, e.g. 10 to 30, of the autofocus camera can be illuminated and evaluated.

In order to keep the influences produced by the projection of the modulation object as low as possible, the structure of a spatially modulated modulation object is preferably displaced laterally in an alternating fashion in rapid sequence (e.g. with more than 30 Hz). A further possibility which is also given in an adjustable light modulator consists of illuminating only certain parts of the area of the object field/workpiece space detected by the lens at all times or only temporarily (e.g. after finding the boundary surface). The image contrast for the autofocus can thus be increased.

The relevant aspect for boundary surface detection is that either the modulation object stands obliquely in relation to the focal plane of the objective or the camera image plane stands obliquely in relation to the image plane of the autofocus projection optics. The oblique positioning can be achieved by the modulation object or the camera standing obliquely in relation to the optical axis. In consequence, it is possible to have the modulation object stand obliquely in relation to the optical axis and the image plane of the camera stand perpendicularly in relation to the optical axis. It is possible that the modulation object stands perpendicularly in relation to the optical axis and the image plane of the camera can stands obliquely in relation to the optical axis. It is also possible to position both the modulation object and the image plane of the camera obliquely. In this case, they may not stand in conjugated planes.

It is preferable in all variants of the microscope to use a computational evaluation apparatus which performs the signal evaluation of the camera(s), controls an optionally adjustable light modulator and performs the control of optionally provided adjusting units on the microscope (e.g. for focus adjustment, x/y adjustment, for swiveling in and/or activating filters, etc.). Evaluation and control can be implemented by means of both hardware circuits and software. The autofocus device of the invention is obviously controlled in operations by a control device which comprises the computational evaluation apparatus and which initiates the measures explained here in order to realize the described procedure. The control device can be a control device that is provided in the microscope anyway.

In negative cases the light modulation which is proven on the camera, i.e. the image of the object that is projected into the sample, can be impaired by speckle effects. It may be advantageous for such purposes to move the workpiece or the modulation object and/or optionally the light source illuminating the same in a monotonous or a periodic way in order to average out any speckle pattern. A synchronous movement of modulation object and camera is also an option.

It is understood that further cameras can be reflected in which derive structural information from the sample. These cameras are arranged in such a way that different planes of intersection of the sample can be projected onto the same, i.e. the cameras are arranged with different angles of tilt in relation to the optical axis or with different rotation angles against the optical axis.

In order to increase the autofocus catch range in the z-direction, a camera can additionally be provided in a plane which is not conjugated in relation to the light modulator. The catch range can be set by the respective tilting angle. The oblique positioning of a camera arranged in a non-conjugated manner is equivalent to a changed angle which the modulation object encloses with the optical axis. Since this angle can hardly be chosen smaller than 30° for practical reasons due to spherical image errors and reflection losses, the possibility is provided by such a further camera to increase the catch rane of the autofocus device.

The microscope can be arranged especially as an inverse microscope.

An especially good adaption to the different workpieces is obtained when the light modulator can be controlled and is arranged for generating a modulation object which is intensity-modulated spatially or temporally. This controllability can be achieved in such a way that an illuminated LCD or DMD element is used as a light modulator. The employed wavelength preferably differs from the normal illumination radiation in the microscope. Principally, the light modulator and/or the camera of the autofocus device can be coupled into the beam path for the machining radiation. Potentially interfering radiation from the microscope can be suppressed effectively by a suitable spectral filter before the camera of the autofocus device and be blanked out in the autofocus device. The beam splitter is configured in such a way for example that it reflects only a narrow wavelength range, e.g. 20 nm, which does not intersect with the two-photon machining radiation. Principally, the entire visible range and NIR and UV can be used for the autofocus function.

An especially simple analysis of the modulation object projected to the sample is obtained when the projected modulation object has a periodic structure, e.g. a strip grating structure. The light modulator is designed accordingly.

Appropriately, the autofocus device will be reflected into the beam path of the microscope via a beam splitter, with the projection of the modulation object and also the return imaging of the projected modulation object to the camera simultaneously being coupled in via the same beam splitter. This is not mandatory, however.

The angle of oblique position of the image plane of the camera or modulation object in relation to the optical axis sets the catch or depth range in which the autofocus device works. An angle of between 20° and 70° is appropriate. As already mentioned, one can use several cameras whose image planes are inclined in relation to one another, especially differently.

When working with a spectral separation of autofocus radiation and machining radiation, it is obviously advantageous to suppress the spectral ranges of the machining radiation in the autofocus beam path as far as possible. Any beam components which pass a dichroic beam splitter for example and thus still reach the autofocus beam path are then preferably suppressed by suitable filters. An especially good filtering is possible when the image of the modulation object disposed in the sample is projected by using an intermediate image to the camera. Then there is sufficient space to use cut-off filters.

A further suppression of interfering radiation is achieved when a radiation trap which absorbs any radiation which is transmitted in the beam splitter and is no longer used is provided at the beam splitter which separates in the autofocus beam path the illumination, i.e. the projection of the modulation object onto the workpiece, from the detection, i.e. the imaging of the reflection onto the camera.

The use of an intermediate image comes with the further considerable advantage that there is a large distance between the detecting camera and the beam splitter which separates the autofocus illumination and autofocus detection. Thus, unavoidable scattered light from the beam splitter reaches the camera only via multiple reflections, i.e. in a strongly attenuated fashion. The use of intermediate image further suppresses reflections from optical units which are disposed between the beam splitter and the camera.

It is understood that the features mentioned above and yet to be described below can be used not only in the stated combinations but also in other combinations or alone without departing from the scope of the present invention.

BRIEF DESCRIPTION OF THE DRAWINGS

The invention will now be explained in more detail by way of example by reference to the drawings, wherein:

FIG. 7 shows a microscope similar to that of FIG. 3 with an autofocus device in which intermediate projection optics are disposed upstream of the camera;

FIG. 8 shows a top view of an exemplary light modulator;

DETAILED DESCRIPTION

Figure 1:
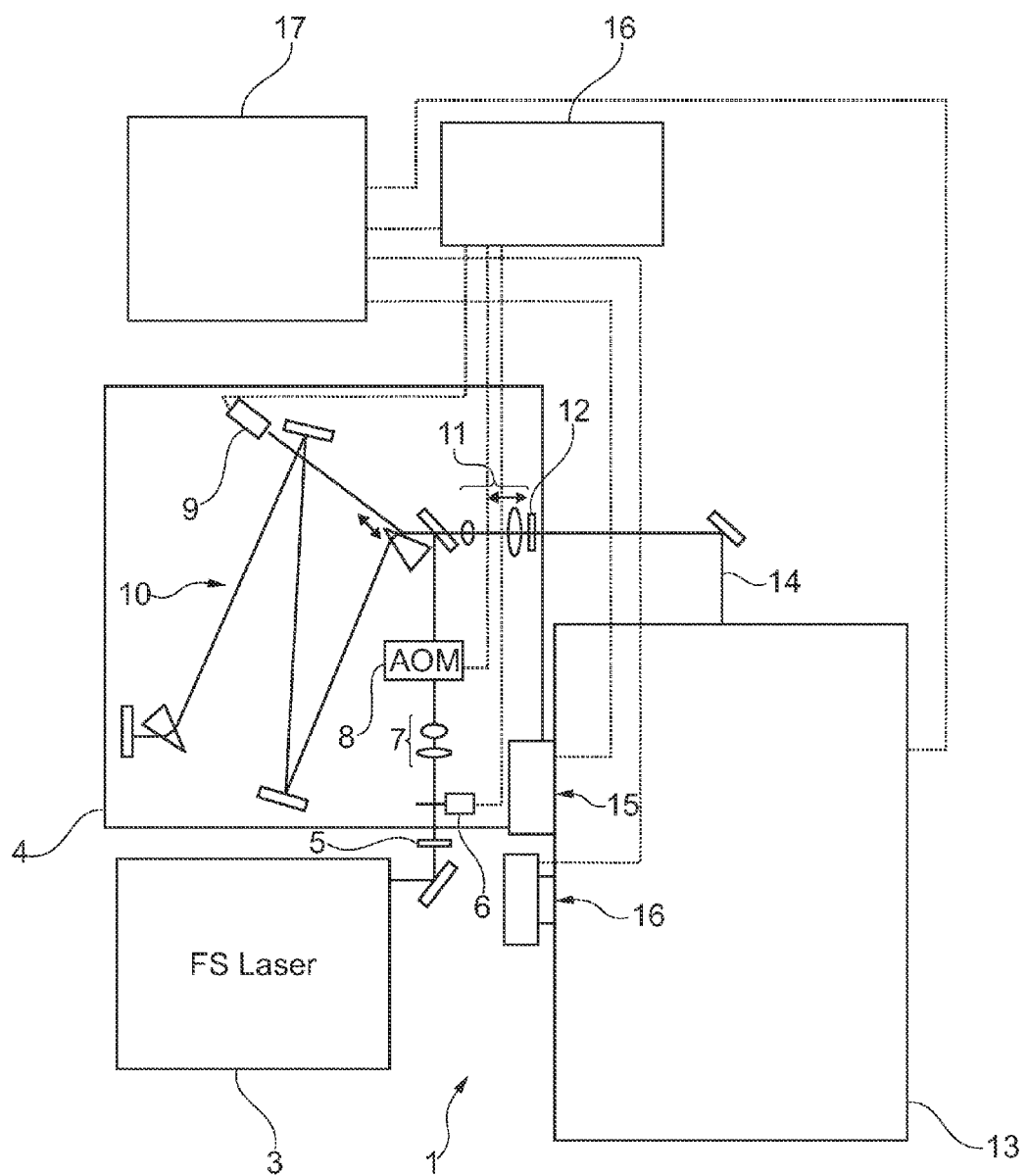
FIG. 1 shows a schematic view of a microscope for laser scanning lithography.

FIG. 1 shows a laser scanning microscope 1 with which a multi-dimensional structure is produced by means of direct laser writing (i.e. per laser scanning lithography) in a workpiece which can be a polymer layer on a substrate for example. A two-photon process is used.

The illustration in FIG. 1 is greatly simplified. The microscope 1 uses a pulsed laser 3, e.g. an fs-laser, as a radiation source for the laser writing. The radiation of the laser 3, e.g. with a mean wavelength of 780 nm for example, is shaped in a pulse conditioner 4 into fs-pulses. For this purpose, the radiation is guided at first via a ½ wavelength plate 5, a mechanical shutter 6, a telescope 7, and an acousto-optical modulator (AOM) 8 and thus controlled in its intensity. The monitoring of the control (e.g. per closed-loop feedback) occurs via a monitor diode 9 which receives a share of the radiation.

After suitable setting of the group velocity dispersion (GVD) by means of a GVD module 10 in order to obtain the shortest possible (i.e. bandwidth-limited) pulses in the object plane, the beam is widened in an adjustable telescope 11, guided via a ¼ wavelength plate 12 and a deflection mirror for coupling into microscope beam path 13, so that there is an optimal filling of the object pupil there. The coupling in of the thus provided machining laser beam 14 at the microscope beam path occurs in such a way that no further optical elements except mirrors and beam splitters are located before its objective. The objective focuses the laser beam into the workpiece which is fastened to a piezo-table. The piezo-table is an example for a scanning arrangement which shifts the position of the focal point on or in the workpiece.

In addition to an autofocus detector 15 yet to be described in closer detail, the microscope beam path 13 further comprises a camera 16 with which a calibration of the autofocus can be performed and an image of the sample, preferably in transmitted light, can be obtained through conventional, spectrally filtered illumination with a halogen lamp or by LED illumination. The microscope beam path 13 linked the autofocus detector 15 and camera 16 is schematically shown in FIG. 2.

A laser control device 16 is provided for controlling the laser. The entire microscope 1 is controlled by a microscope control unit 17. Control lines are shown by way of example by the broken lines in FIG. 1.

Figure 2:
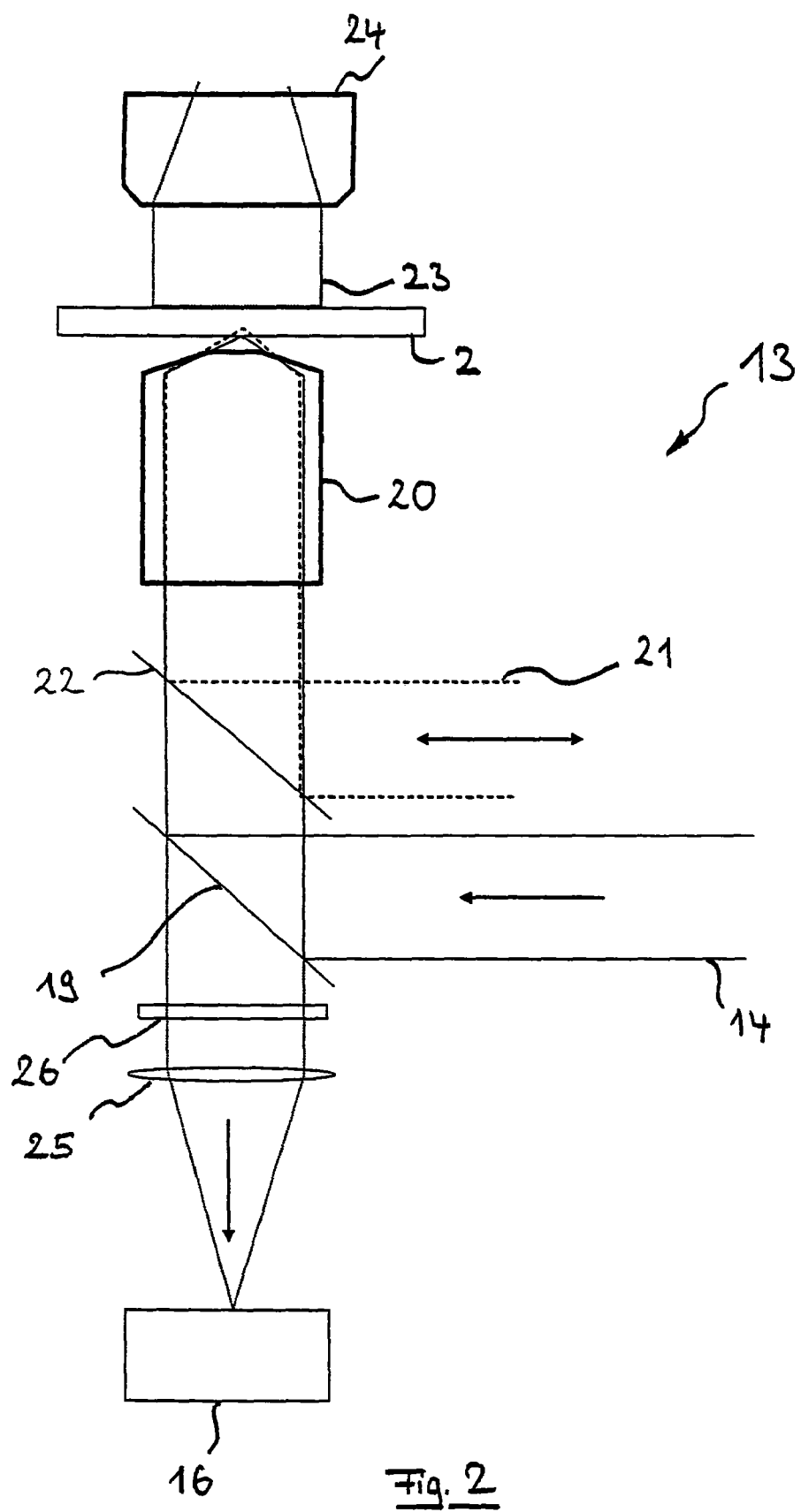
FIG. 2 shows a part of the microscope of FIG. 1 in a detailed view.

FIG. 2 schematically shows a part of the microscope beam path 13. As already explained by reference to FIG. 1, the machining laser beam 14 is coupled in via a beam splitter 19. The beam splitter 19 is reflective for the wavelength of the machining radiation which is at 780 nm for example. In particular, the beam splitter 19 can especially be arranged as a dichroic which reflects radiation in a wavelength range above 750 nm, but otherwise transmits radiation. The thus coupled in machining laser radiation 14 is then focused by an objective 20 onto or into the workpiece 2 in order to trigger changes there by means of two-photon processes, especially generate a three-dimensional structure in a photoresist or resist.

Two-photon processes are known to be used in order to machine materials which are transmitting, i.e. they are not capable of being machined by linear absorption. The camera 16 is used for evaluating or monitoring the usually transparent workpiece 2, the inclusion of which camera in the beam path will be explained below in closer detail.

To assist the direct laser writing by means of the machining laser beam 14 an autofocus device is linked to the microscope beam path 13 for, wherein an autofocus beam path 21 is coupled via a beam splitter 22 into the beam path of the machining laser radiation and thus before the objective 20. A double arrow is schematically shown in the illustration of FIG. 2 for the autofocus beam path 21 in order to illustrate that both a coupling in of autofocus illumination and an autofocus detection occur through the autofocus beam path 21. The beam splitter 22 is therefore reflective for the wavelength range of the autofocus illumination and the respective detection, e.g. for radiations above 800 nm. The beam splitter 22 is preferably transparent for the wavelength range of the machining laser radiation, e.g. 780 nm. It is then arranged to be dichroic.

Depending on the chromatic correction, the objective 20 focuses the autofocus radiation which is shown in the schematic illustration of FIG. 2 by the broken line to a slightly other depth than the machining laser radiation 14 which is shown by the unbroken lines.

The already mentioned camera 16 is used for monitoring the workpiece 2 in transmitted-light operation. Radiation 23 is guided into the workpiece 2 by means of the condenser 24 to the side opposite of the objective 20, with the radiation being in a spectral range which the beam splitters 19 and 22 transmit at least partly. The workpiece 2 is then imaged to the camera 16 in transmitted-light operation by means of a tube lens 25 and the objective 20. The tube lens 25 is provided upstream with a filter 26 in one embodiment, which filter ensures that predominantly transmitted-light illumination, e.g. at 580 nm, will reach the camera 16. The filter 26 can be arranged as a short-pass filter for example with a filter edge of 750 nm.

Camera 16 thus images the workpiece 2 in transmitted-light operation or, when fluorescence occurs in the workpiece 2, also in fluorescence radiation operation. A wavelength which is possible for the camera in this case lies in the range of 400 to 600 nm.

Figure 3:
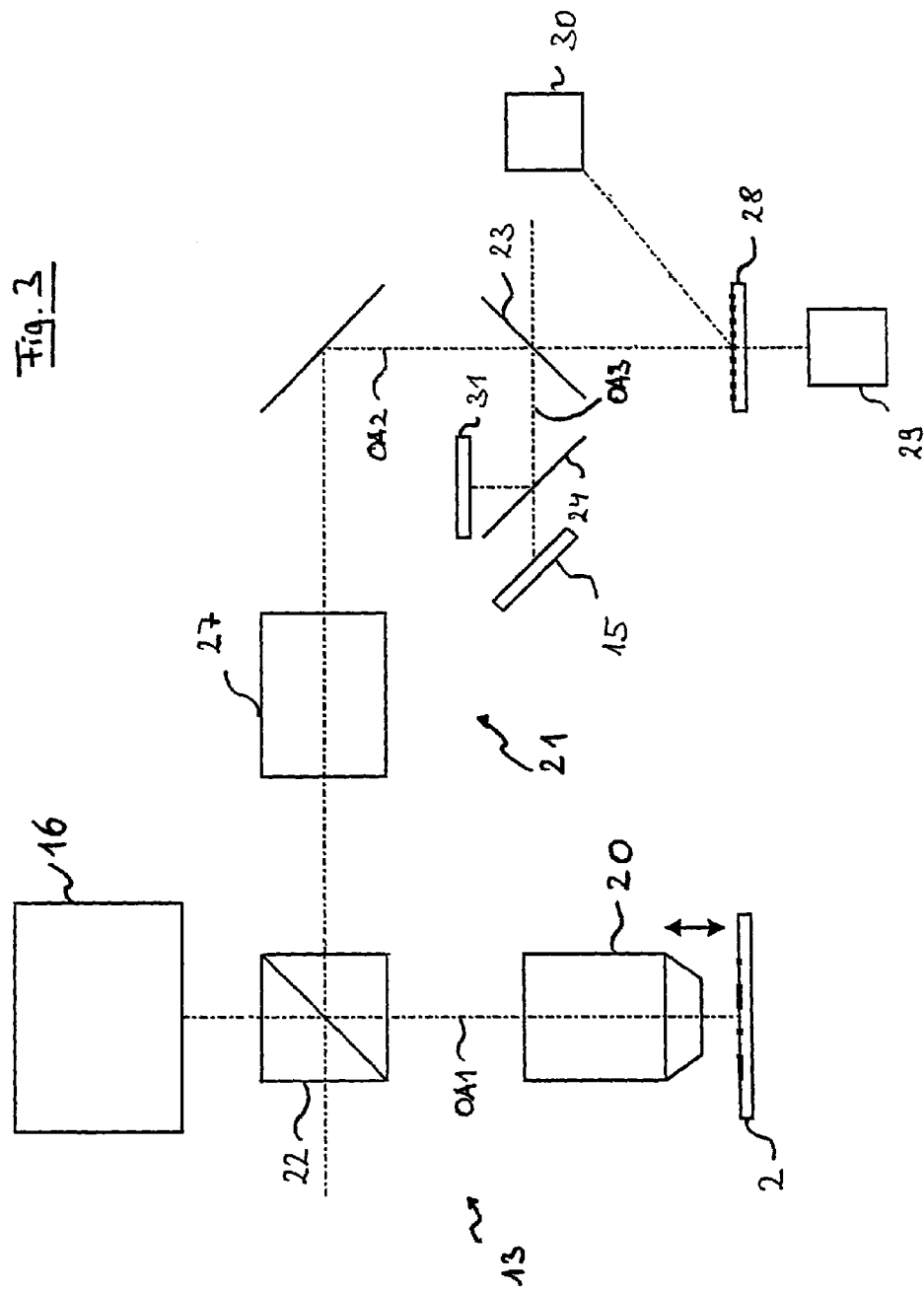
FIG. 3 shows the microscope of FIG. 2 with the illustration of the autofocus device.

FIG. 3 shows the microscope beam path 13 in combination with a possible embodiment for the autofocus beam path 21.

Autofocus illumination radiation is coupled in via illumination tube optics 27 onto the workpiece 2 and through the objective 20. The autofocus beam path 21 further comprises a light modulator 28 which is illuminated by a light source 29 for transmission operation or by a light source 30 for reflection operation. The illuminated light modulator 28 generates an illuminated modulation object. It is projected, and therefore imaged, via the illumination tube optics 27, the beam splitter 22 and the objective 20 into the workpiece 2. Autofocus illumination is thus realized. The image generated in the workpiece 2 is detected in the opposite way by the autofocus detector which can be arranged for example as a 2D camera 15 and which is provided upstream with a further beam splitter 23 on the optical axis OA2 of the autofocus device.

The radiation propagating along the optical axis OA3 is optionally further guided via a beam splitter 24 to a further camera 31.

The beam splitter 22 is arranged in one configuration to be dichroic, as already mentioned above, and the light source 29 and 30 radiates at a wavelength for example which is otherwise not required in the microscope. The autofocus device thus works in a spectral range which is not used for the imaging or machining of the workpiece 2.

The drawings mostly only show the image planes of the cameras and the detectors. The cameras can generally be CCD cameras, and the light sources LEDs.

In the configuration of FIG. 3, the light modulator 28 and thus the modulation object stand perpendicularly to the optical axis OA2. The camera 15 however stands with its image plane obliquely in relation to the optical axis. When the light modulator 28 performs a spatial modulation, e.g. by a strip pattern, the maximum contrast can be found in a line of the camera 15 which is perpendicular to the plane of the drawing. The position of this line along the camera 15 is a measure for the position of the focal plane along the optical axis, i.e. in the z-direction.

The modulation object which is produced by the light modulator 28 either in transmission operation (light source 29) or in reflection operation (light source 30) is projected into the workpiece 2 with the help of the illumination tube optics 27 and the objective 20. Depth resolution occurs by the obliquely positioned camera 15. A lateral displacement of the structured illuminated sample can be detected by means of camera 31.

The microscope 1 is arranged for machining as a scanning microscope without any further limitations concerning the autofocus device. An inverted configuration as shown in FIG. 2 or an upright configuration as shown in FIG. 3 can be used similarly.

Figure 4:
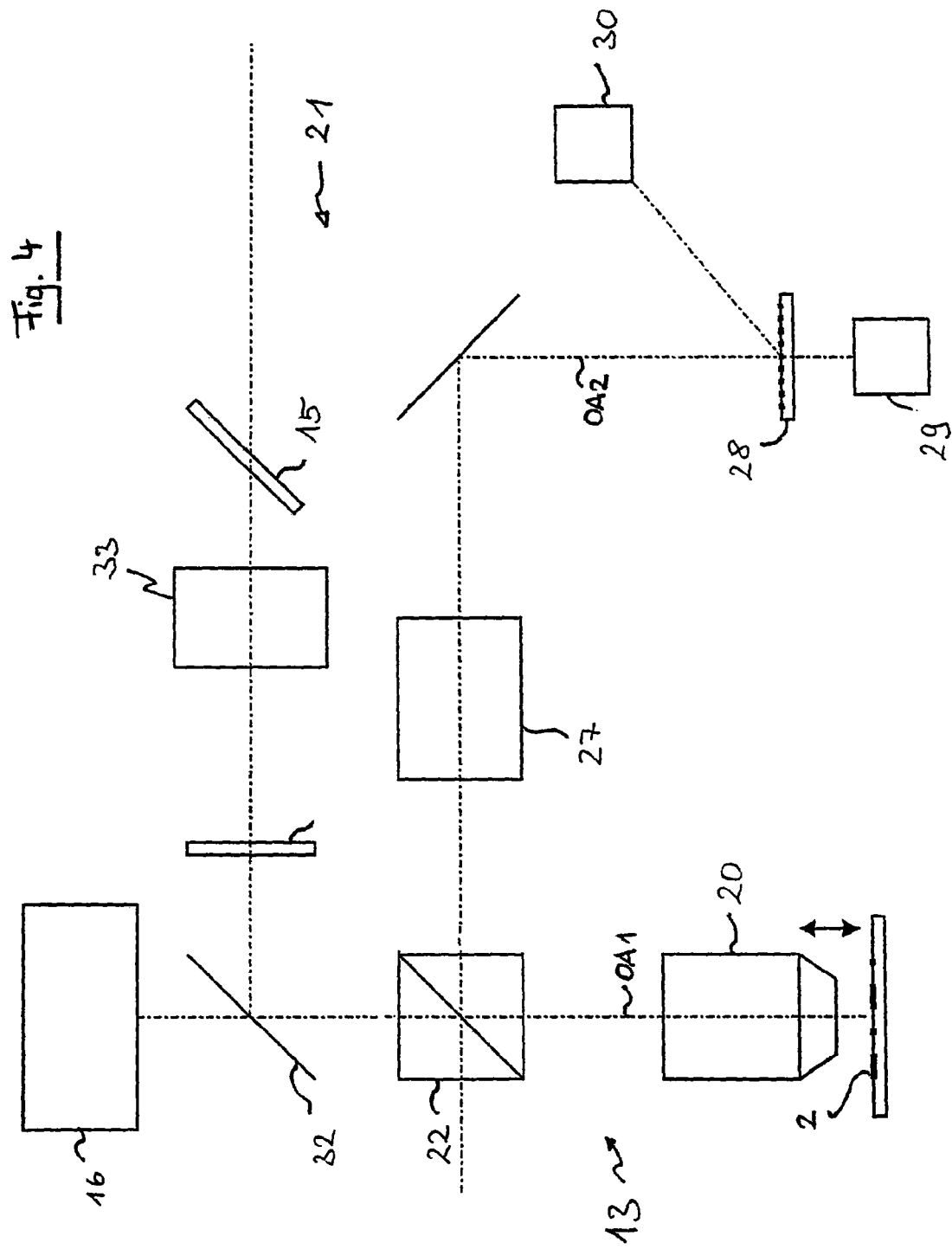
FIG. 4 shows the microscope of FIG. 2 with an autofocus device modified in comparison with FIG. 3.

FIG. 4 shows an alternative arrangement of the microscope of FIG. 1 concerning the autofocus device. In the microscope of FIG. 4, the components that have already been explained above are provided with the same reference numerals. Their description is therefore not repeated. Camera 15 detects here the image of the structured autofocus illumination through a separate detection beam path.

For this purpose, the microscope beam path 13 is provided with a separate beam splitter 32. It is selected according to the wavelength of the autofocus illumination and is dichroic to the same extent for example as the beam splitter 22. In order to enable detection of the modulation object projected into the sample or the reflections or backscatters by means of the camera 15, respective relay optics 23 are provided upstream of the camera 15 whose optical characteristics will ensure that the image plane of the camera 15 intersects a conjugated plane to the modulation object, ideally close to or on the optical axis (as also in FIG. 3).

The signals supplied by the autofocus device, especially the camera 15, are used for controlling the focus shift along the z-axis. This is schematically illustrated in FIG. 4 by a double arrow. The control unit used for this purpose is shown in FIG. 1 with reference numeral 17.

Figure 5:
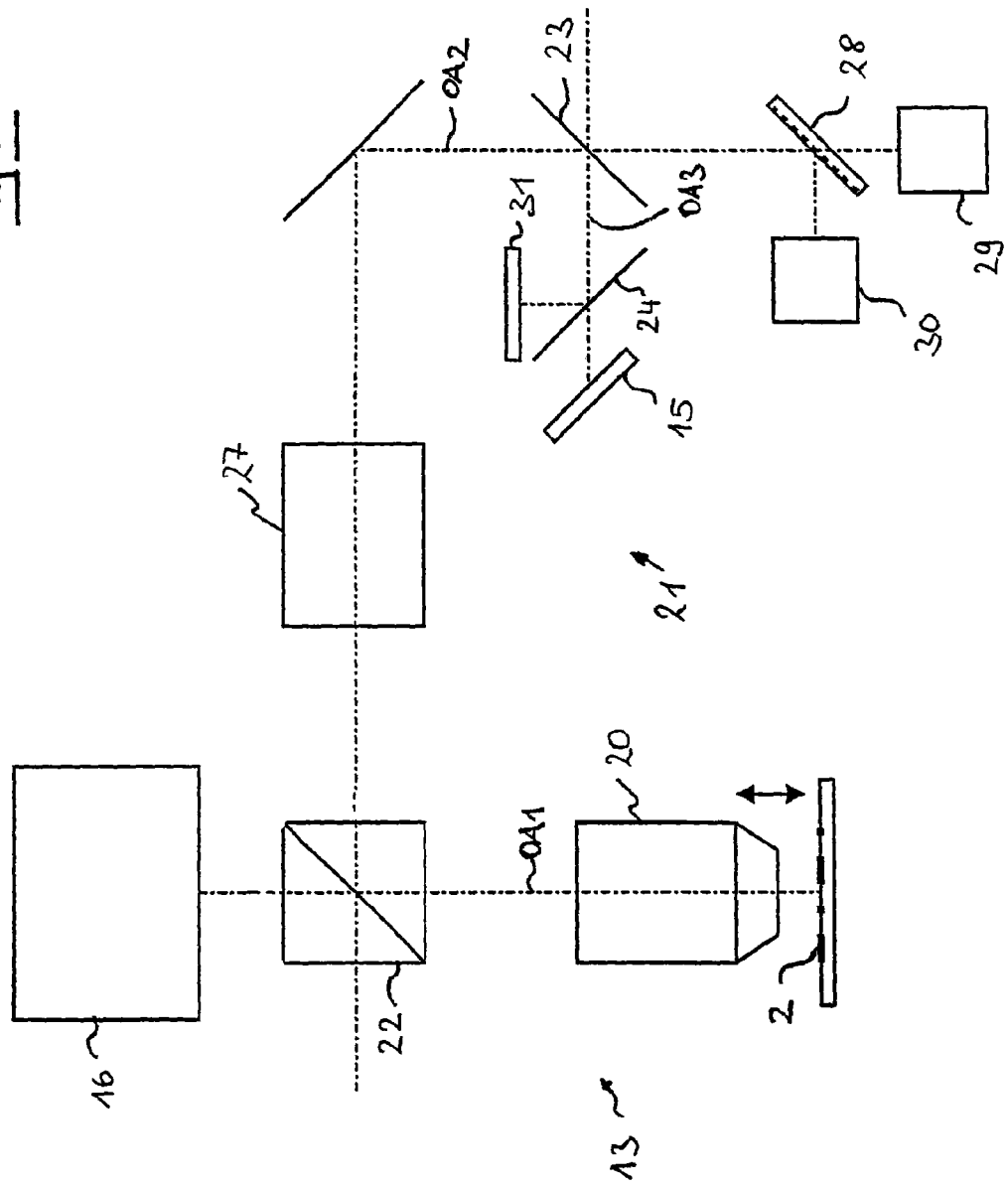
FIG. 5 shows a microscope similar to the one of FIG. 3.

FIG. 5 shows an arrangement of microscope 1 for strongly scattering and low-reflective samples. Elements that have already been explained above shall not be described again. They are provided with the same reference numeral in the drawing.

The autofocus device according to FIG. 5 is modified for strongly light-scattering objects. It realizes a device which primarily analyzes the light scattered from the sample.

In this arrangement, the two-dimensional light modulator 28 encloses an angle of between 0° and 90° with the optical axis OA2, preferably between 20° and 70°. The light modulator 28 again corresponds to the configuration that has already been described, i.e. it can be a transmission LCD, a reflection LCD, a DMD or an amplitude grating with displacement apparatus. The structure preferably again consists of light/dark strips. The light modulator 28 is preferably illuminated from one or several powerful LEDs. This was also possible in the variants explained above. The light source 29 is provided in a transmission modulator, and the light source 30 in a reflection modulator. Conventional optical apparatuses for light homogenization and optics for intermediate images can be used for generating the modulation object using the light modulator 28 and are not shown in FIG. 5 (and in the preceding drawings) for reasons of clarity.

The modulation object is projected into the workpiece 2 with the help of the illumination tube optics 27 and the objective 20. Since the light modulator 28 and thus the modulation object do not stand perpendicular to the optical axis, the modulation object (e.g. alternating light/dark strips) are projected obliquely in relation to the optical axis and thus into the depth of the workpiece.

The image plane of the camera 15 lies in a plane conjugated to the light modulator 28 and thus to the modulation object. It is therefore tilted at the same angle in relation to the optical axis (which is here the optical axis OA3) as the light modulator 28. Light scattered from the sample is imaged in a modulated manner to the camera 15. The contrast of the modulation object appears in the camera 15 only where it is scattered from the workpiece. That is why the arrangement in FIG. 5 is especially suitable for thin or scattering workpieces.

In addition, the autofocus device for the autofocus function further comprises the camera 31 whose image plane stands obliquely in relation to the light modulator 28 and thus the modulation object because it is disposed perpendicular to the optical axis OA3. It is linked via a 50% splitter 24 within the autofocus beam path 21.

A further modification of the autofocus device is possible in the respect that the camera 15 is now tilted in the opposite direction in relation to the light modulator 28. The image plane of camera 15 and the light modulator 28 are then not conjugated with respect to one another. The catch range can thus be enlarged, and typically doubled.

The configurations of FIGS. 3 to 5 show the arrangement of the autofocus device in an upright microscope 1. A cover glass and an immersion fluid (e.g. oil, water, glycerine) can be disposed between slide and objective. This is not mandatory however. There are two applications that need to be distinguished: Without the immersion fluid, the highest contrast is obtained at the air/gas boundary surface on the upper side of the cover glass or slide. With the immersion fluid, the highest contrast is obtained at the boundary surface between bottom side of cover glass and embedding medium. In order to suppress scattered light or undesirable reflections, stops such as semi-spherical stops can be introduced into the autofocus beam path.

The beam splitter 22 can be a plane-parallel glass pane which is AR coated on one side in order to avoid disturbing secondary images. The side of the glass pane used for the reflection of the autofocus signal can also have a dichroic coating which increases reflectivity for the for the long-wave autofocus light (when the variant with long-wave autofocus illumination is used) and predominantly transmit the short-wave useful light of the machining radiation. It is understood that other spectral divisions are also possible.

In order to achieve a high resolution as is usually required in direct laser writing, immersion fluid is used so that there is a jump in the refractive index at the boundary surface between cover glass and workpiece 2 or its polymer resist layer. The described types of microscopes with separate autofocus arrangement allow determining the position of this boundary surface during direct laser writing insofar as it is ensured that the wavelength used for the autofocus has no undesirable machining effect on the workpiece 2, e.g. not exposing a photo-resist.

The decisive aspect for using the autofocus is a precise calibration of the boundary surface position with a precision adjusted to the resolution of the autofocus. A reference object is used for a calibration process provided before the direct laser writing, which object is preferably covered with a cover glass which is preferably as thick as the cover glass of the workpiece 2 because the only slight, but still existing difference in refractive index in relation to the immersion oil. A simple reference sample which is to be measured precisely consists of a suitable dye solution (e.g. fluorescein) covered by the cover glass. This dye solution as a reference sample comes with the advantage (like other solutions too) that photochemically destroyed dye molecules in the focus of the machining radiation are automatically replaced by diffusion. One alternative for a fluid dye solution as a reference sample is to dissolve a dye in a photo-resist and to spin-coat the same with the resist on a cover glass.

The dye preferably enables a fluorescence excitation by two-photon absorption at the wavelength of the machining radiation, e.g. 780 nm.

Figure 6:
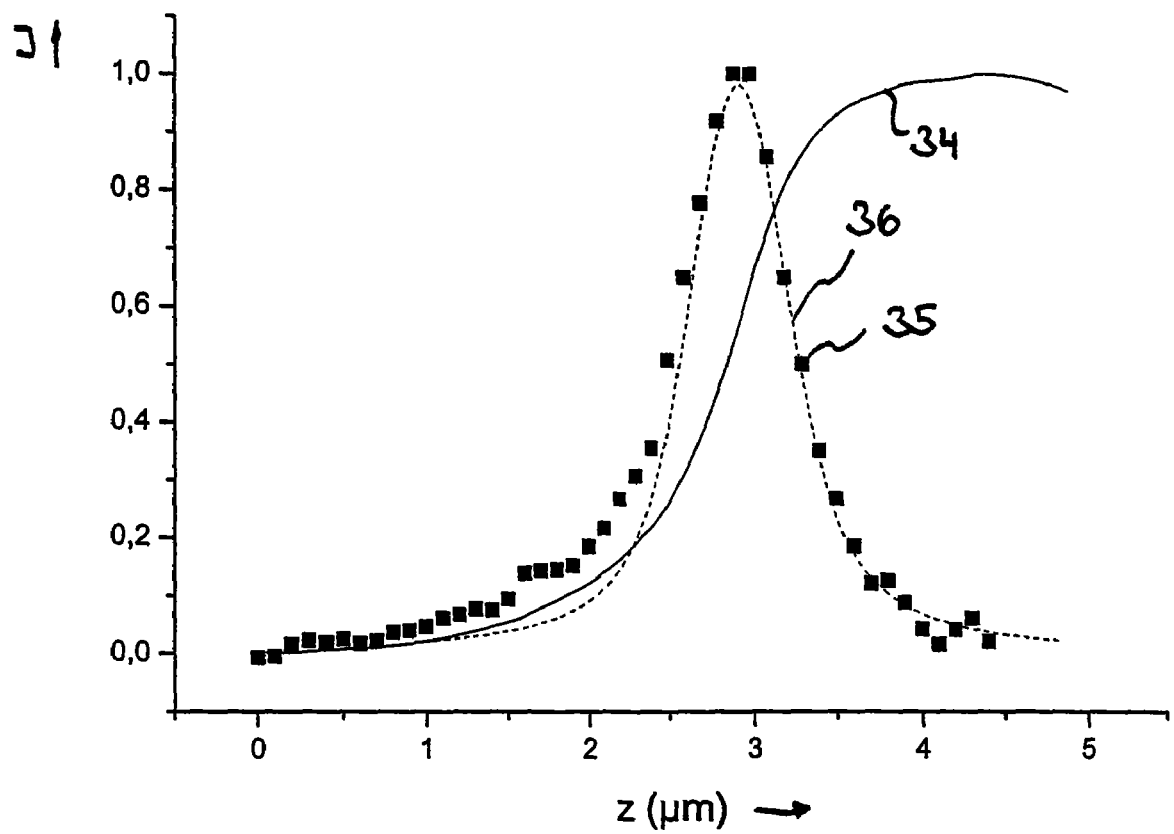
FIG. 6 shows a graph for explaining the determination of the boundary surface in a calibration step.

Now, the calibration is performed such that a series of pictures is taken with the camera 15 with stepwise focusing of the machining laser radiation 14 close to the boundary surface from the cover glass into the medium with the dye. The described filters arranged upstream of the camera 15 ensure that they absorb only light at wavelengths longer than that of the machining laser radiation, which acts in this case as excitation laser radiation. The plane of the boundary surface between cover glass and fluorescence solution is determined from this series of pictures. In order to increase the measurement precision it is optionally possible to average the signal taken with the camera 15 over a suitable image region around the focal spot. The illustration of the signal thus obtained as a function of the z-coordinate which extends along the optical axis OA1 is shown in FIG. 6. It shows on the vertical axis the intensity I of the signal in random units. The axial coordinate z is shown in micrometers on the transverse axis. Curve 34 is the intensity signal as a function of the z-coordinate. The measurement points 35 are obtained from the derivation of the curve 34 or from the measuring points generating this curve. An interpolation 36 may increase the precision even if deviations are present in the measurement points 35. The position of the maximum of the interpolation 36 or the measurement points 35 represents precisely the z-coordinate of the boundary between cover glass and sample. This z-position is now compared with the respective data of the autofocus device and determined as a reference point.

In order to avoid deviations from aberrations, the focus of the autofocus illumination radiation should coincide with the focus of the machining laser radiation 14 to the highest possible extent during the described calibration process and the chromatic correction should optionally be designed in such a way that the focus of the autofocus illumination radiation should rather lie somewhat in the cover glass or in the immersion medium when the machining laser radiation 14 is focused precisely on the boundary surface.

FIG. 7 shows an inverse microscope 1 with an autofocus device which is in the state of the calibration discussed above. An upwardly open cuvette 37 with a dye solution is therefore used instead of the workpiece, which cuvette is sealed with the mentioned cover glass 38 against the immersion microscope.

In the configuration of FIG. 7 the beam path 21 of the autofocus device is linked via a beam splitter 22 to the microscope beam path 13. In all other respects, the statements made above apply analogously. In addition, an optional spectral filter 39 is shown in FIG. 7 which filters the spectral range of the autofocus illumination radiation in a suitable manner. Illumination optics 40 for generating the modulation object from the light modulator 28 are also shown by way of example. For the purpose of homogeneous illumination of the light modulator 28, the illumination optics 40 preferably also contain a diffusing plate. Illumination optics 40 can be used in all described variants.

FIG. 7 further shows that the signals of the camera 15 are guided to a control unit 18 which makes the respective calculations and controls, among other things, the mentioned drive 41 for z-adjustment of the focal position. It is obvious that the control unit 18 is usually also connected with the light modulator 28 insofar as the same can be controlled. The same applies to the light source 39 or 30 and a radiation source 42 of the machining laser radiation. The control unit is either connected with the microscope control unit 17 or is integrated in the same.

Imaging optics 43 are provided upstream to the camera 15 in the autofocus beam path 21, so that it is not the image of the modulation object that is projected directly to the camera 15 but an intermediate image 44. It is understood that this principle, which is shown in FIG. 7 in the example of an inverse microscope, can be applied principally. The light modulator 28 which is arranged here as a transmission grating and the intermediate image 30 lie in planes which are conjugated to the focal plane in the workpiece and to the plane which intersects the camera 15.

The projection of the image of the modulation object disposed in the workpiece or the reference object by using the intermediate image 30 comes with the considerable advantage that the autofocus (AF) beam splitter 23, which can be arranged as a 50:50 beam splitter for example, is disposed at a large distance from the camera 15. Unavoidable scattered light from the AF beam splitter 23 thus reaches the camera 15 only via multiple reflections, i.e. in a strongly attenuated manner. In addition, all reflections towards the camera 15 originating from optics to the right of the AF beam splitter 23 are additionally avoided by coupling in the intermediate image.

An IR LED is used as a light source 29 in an exemplary configuration of the autofocus device for the microscope 1 of FIG. 7, whose center wavelength lies above 800 nm, preferably at 830 nm. The light source 29 is connected with the control device 18, so that it is switched on and off as required, is temporally modulated or can be adjusted in its brightness.

The light modulator 28 is arranged as a slot-shaped transmission grating. In order to illuminate the slots as homogeneously as possible and to utilize the radiation of the illumination source 29 as efficiently as possible, the illumination optics 40 are provided e.g. as collimator optics with anamorphic optics which cause a line type illumination. Filter 39 is optimally provided upstream (or alternatively also downstream) of the light modulator 28, which filter is provided as an IR bandpass filter and is adjusted to the center wavelength of the IR LED. The bandpass width lies between 10 and 50 nm, whereby undesirable spectral components of the light source 29 are suppressed.

One example for a light modulator 28 is a transmission grating 45, as is shown by way of example in FIG. 8 in a top view. It consists of a slot-like stop which contains a periodic grating structure 46. This grating slot is disposed in the center of the image or close to the center of the image in order to ensure the largest possible catch range of the autofocus device. As is shown in FIG. 8, further grating slots 47 can be provided with other grating periods in order to optimize the imaging contrast on the camera by selection of the grating period. A narrow gap 48 without grating structure can also be provided. The light reflected by the glass/fluid boundary surface reaches a separately readable component of the camera 15. The defocusing can roughly be determined outside of the actual catch range on the basis of the projected brightness distribution over the slot. Initial focusing is thus possible, even when there is no contrast signal from the grating on the camera 15. The control device 18 can thus determine the direction in which the z-adjustment needs to be done, i.e. how the drive 41 needs to be controlled in order to return to the primary catch range. If the slot is sufficiently narrow, the brightness is higher as a result of confocal suppression on camera 15. The displacement path required to return to the primary catch range can be derived from the gradient of the brightness distribution. This is performed by the control device 18.

A light trap 49 is provided in the AF beam splitter 23 which absorbs radiation from the light modulator 28 which would otherwise be transmitted. The light trap 49 is preferably arranged as a plate of a strongly absorbing material which is positioned obliquely in relation to the optical axis, e.g. as a polished NG1 plate. NG1 is a strongly absorbing black glass.

The dichroic beam splitter 22 reflects only radiation of the wavelength as is guided in the autofocus beam path 21 behind the bandpass filter 39. Other spectral components are transmitted. For this purpose, the beam splitter 22 comprises an interference layer for example which substantially transmits the radiation lower than 800 nm at an angle of incidence of 45° and substantially reflects radiation with the center wavelength of the IR LED. The beam splitter 22 can also have a bandpass-like spectral behavior, so that wavelengths above the autofocus spectral range (e.g. above 840 nm) are also substantially transmitted at an angle of incidence of 45°. It is understood that these beam splitter features can also be used in other embodiments.

Preferably the beam splitter may be arranged to be exchangeable, e.g. by means of an exchange wheel or any other changing mechanism.

Blocking filters 50 are provided upstream of the projection of the modulation object disposed in the sample or of its intermediate image 30, which filters ensure that only radiation of the respective autofocus spectral range will reach camera 15. Other radiation which can originate from the imaging of the sample is thus suppressed again.

The imaging optics 43 image the projection of the modulation object disposed in the workpiece or in the reference object or the image reflected on the boundary surface to the camera 15. The imaging optics 43 can be composed of a tube lens 51 and a standard objective 52 of small numerical aperture (e.g. NA=0.2).

Figure 9:
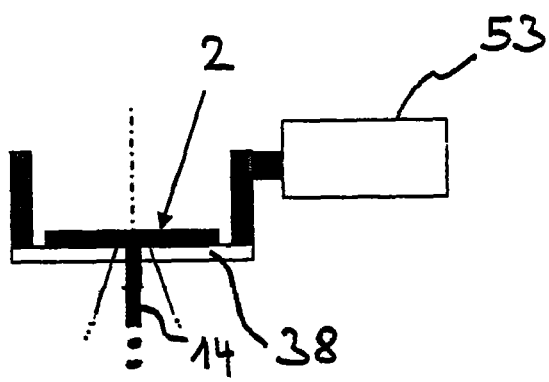
FIGS. 9 and 10 show contrast signals which are emitted by a camera of the autofocus device of FIG. 3 or 7.

FIG. 9 shows the modification of the configuration of FIG. 7 as is provided in the case of direct laser writing on a workpiece 2. Instead of the cuvette 37, there is now the workpiece 2 with the cover glass 38 which is disposed above in relation to the direction of incidence of the radiation. Furthermore, a scan actuator 23 is shown which performs the (x,y,z) adjustment of the workpiece 2 for generating a three-dimensional structure by means of laser writing, as already mentioned above. It is understood that the scan actuator 23 is connected via lines (not shown) to the microscope control unit 18 which controls the entire operation of the device.

Figure 10:
Figure 11:
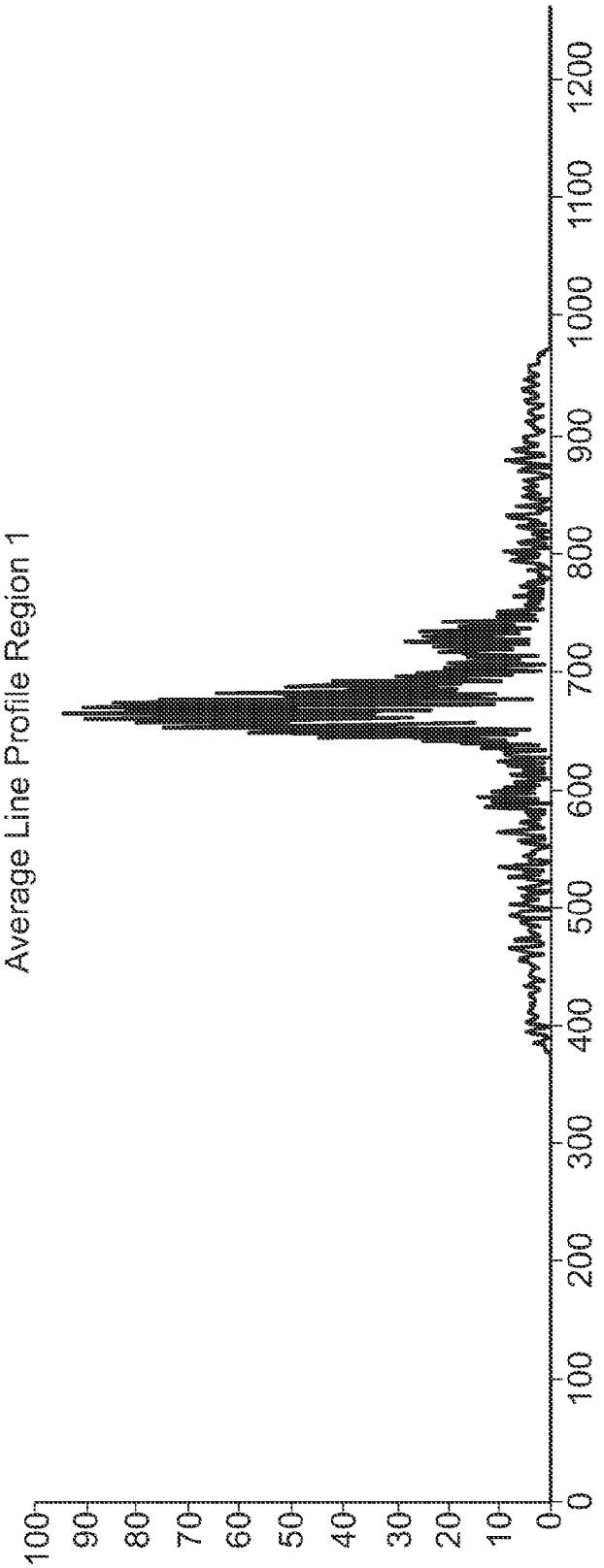
FIG. 11 is a graph depicting the amount of derivation of the contrast signal in the autofocus system.

FIGS. 10 and 11 show the contrast signal of the camera 15 in the autofocus system, e.g. the configuration according to FIG. 7. FIG. 10 shows the contrast signal in greyscale representation in the camera plane and FIG. 11 shows the amount of derivation of the contrast signal. In both drawings, a representation application is applied the pixel number in the x-direction. The derivation of the contrast signal occurs for the purpose of suppressing all signal components which do not have the grating contrast projected into the object plane. Alternatively or in addition, the contrast signal can also be subjected to Fourier filtering, with all frequencies being eliminated which do not correspond to the grating period in order to optimize the signal quality. This corresponds to a bandpass filtering in which the grating frequency lies in the middle of the bandpass.

The catch range of the autofocus system is predetermined by the range of the z-displacement of the objective 20 (or the boundary surface) in which a contrast signal that can be still be evaluated is present at the autofocus camera. Two conditions need to be fulfilled for this purpose:

1. The contrast signal must still be located within the image field.
2. The contrast signal must have a sufficient signal level which lies significantly above the noise level.

The range in which the boundary surface can be found is limited. The catch range is symmetrical in case the center of contrast lies in the middle of the image field when the focal plane of the objective 20 lies precisely on the boundary surface.

The autofocus contrast decreases in the displacement of the center of contrast from the middle of the image field to the edge of the image field. This reduction in the signal-to-noise ratio results mainly from spherical aberration and from coma, two image errors which increase consistently towards the edge of the image field. For this reason, the image field size on the obliquely positioned autofocus camera should be chosen such that the contrast level is just about sufficient at the edge of the catch range. The size of the camera is selected accordingly.

In order to eliminate any disturbing limitation here, a further development is provided which is shown by way of example in FIG. 7 with the broken line. It comprises a longitudinal adjusting mechanism 54 which varies the distance between the autofocus objective 52 and the autofocus camera 15. For this purpose, the objective 52 can be moved in relation to the fixed camera 15 or the camera 15 can be moved in relation to the fixed objective 52 along the optical axis OA2. All known drive techniques such as spindle drives, stepper motors, DC motors, piezo-actuators, etc. are suitable for the longitudinal adjusting mechanism 54 which is preferably electronically driven.

The variation of the distance between the autofocus objective 52 and the camera 15 is only one example for the generally underlying principle of longitudinal adjustment of the camera 15 in relation to the image plane of the autofocus projection. In the simplest of cases, the longitudinal adjusting mechanism can cause a displacement of the camera 15, the projection optics 52 or the light modulator 28. Despite the adjustment of the focal plane, the longitudinal displacement can always image the reflections from the boundary plane onto the camera 15, in that the longitudinal displacement occurs in opposite directions. That is why the distance between autofocus lens and autofocus camera set such that the center of the contrast signal will always lie in the middle of the image field. The following steps are performed for this purpose:

1. The boundary surface is brought to the focal plane of the microscope objective 20 with the help of the z-drive 41. This is the starting position for the autofocus. The center of the contrast signal is now located in the middle of the image field of the autofocus objective 52 where the image errors are lowest.
2. The focal plane of the microscope objective 20 is moved with the help of the z-drive 41 into the workpiece or into the reference object. Simultaneously, the distance between the autofocus objective 52 and the camera 15 is varied in such a way that the center of the contrast remains in the middle of the image field of the autofocus objective 52.
3. The desired focal plane can thus be referenced continually to the boundary surface. The entire defocusing by the z-drive 41 is thus compensated, for while the distance between the autofocus objective 52 and the camera 15 remains constant. As a result of the autofocus function, the center of contrast continues to remain in the middle of the image plane of the autofocus objective 52 and thus in the middle of the camera 15.

The catch and holding range is merely limited by the image errors in the middle of the image field of the autofocus objective 52. It predominantly concerns spherical aberration. The aberrations that increase considerably towards the edge of the image field, especially coma and curvature, no longer have a disturbing effect. In addition, other problems which occur at the edge of the image field such as down edge of the illumination, vignetting and reflection, etc. are avoided.

Since the contrast signal remains in the middle of the image field, the light modulator 28 can also be arranged to be smaller. It no longer needs to extend over the entire image field of the objective 20 in order to maximize the catch range. Less autofocus light is coupled into the microscope radiation, thus reducing the scatter light background on the autofocus camera 15. When a smaller (i.e. shorter) light modulator 28 is used, it is possible to use a smaller and thus more cost-effective camera chip for the autofocus camera 15.

The structure of the light modulator 28 imaged onto the camera 15, its angle to the camera 15, the resolution of the camera 15 and static fluctuations in intensity during the measurement influence the control precision of the z-position. In order to enable changing the control precision during the autofocus for example, which can also be dependent upon the microscope objective 20, several grating structures with different periods which are disposed next to one another as light modulator 28 can optionally be evaluated, as already explained in connection with FIG. 8, and/or the angle of oblique positioning of the light modulator 28 or the camera 15 is adjusted accordingly to a required control precision. The latter option is shown in FIG. 7 with the broken line. An angle adjusting mechanism 55 is provided there.

Once the autofocus adjusting process has been completed, it is preferably possible to electronically adjust the angle of camera 15 for example according to previously defined precision requirements. The adjustment of the angle between the camera 15 and the image of the modulation object occurs in the simplest of cases by rotation of the camera 15 or the light modulator 28 by means of a suitable angle adjusting mechanism.

All known techniques are suitable for this purpose such as spindle drives, stepper motors, DC motors, linear motors, piezo-actuators, etc. The autofocus resolution can be adjusted in the case of a suitable angle and respectively chosen grating with suitable grating spacing.

The illustrated adjusting mechanisms 54, 55 emit a signal which is supplied to the control device 18 of the autofocus device.

The autofocus apparatus therefore operates according to the following principle: A light modulator is illuminated with strip-like modulated transmission grating with a light source such as an IR LED with 840 nm center wavelength. The illuminated modulation object thus generated is projected into the object plane of the microscope objective 20. When a reflective boundary surface is disposed in the object plane or its ambient environment, the grating structure is reflected back and these reflections are imaged onto the 2D autofocus camera 15. Since the camera is tilted in relation to the optical axis of the projection, the grating appears in-focus only in a narrow region of the camera surface. In order to eliminate background noise, the intensity distribution on the 2D autofocus camera can be differentiated in lines. The center of contrast is then determined for each line. In order to improve the autofocus signal quality, the centers of contrast of several lines are optionally also averaged and the position of the averaged center of contrast correlates with the object-side position of the reflective boundary surface relative to the focal plane of the microscope objective 20 and can thus be used as an autofocus signal. It is necessary for the especially high precision requirements that are usually demanded during direct laser beam writing that the center of contrast is located as far as possible close to the center of the image field because the focus of the machining laser 14 is also here. Otherwise, bent portions of the workpiece 2 for example a glass pane on which the polymer (resist) is disposed could lead to deviations in the focus in relation to calibration measurements.

The explained autofocus beam path 21 of the explained autofocus arrangement in the microscope 1 can advantageously contribute to maintaining the short-range and long-range order of a 3D structure to be produced in workpiece 2, even if a transparent workpiece 2. In particular, the boundary surface can be used for reference at any time during the writing process, which can occur either by the autofocus function as explained above or by moving the boundary surface, without having to know any further assumptions on its position. As a result, the current position of the focus in the workpiece relative to the boundary surface can be determined in that the z-position before and after the moving of the boundary surface is read out.

A tilting of the boundary surface, i.e. the surface of the workpiece for example, relative to the optical axis can be detected before the use of the machining laser radiation and be corrected during the direct laser writing. For this purpose, the position of the boundary surface of the workpiece 2 is scanned at fixed, suitably chosen checkpoints and the respective z-positions are recorded. During this preliminary scan, the density of the checkpoints can be chosen freely by the user or can automatically be determined on the basis of a program routine by the microscope control unit 18. The microscope control unit further places in one fit a planar surface through certain z-positions of the checkpoints and determines a tilting of the boundary surface for example, i.e. the surface of the workpiece 2. This tilting will then be considered during direct laser writing when the scan actuator 53 is controlled, so that despite the tilting of the workpiece 2 or its surface the points accessed by focus of the machining laser beam 14 on or in the workpiece 2 are disposed at loci which have a desired relation to the surface. Usually, such points are stated or defined by their distance to a planar surface of the workpiece 2.

If during the fitting of the z-positions of the checkpoints there is an excessive deviation for individual checkpoints, then this indicates a deformation in the boundary surface. Such a deviation can always be determined when more than three checkpoints are used. The deviation can always be determined when more than three checkpoints are used. A machining of a workpiece 2 can therefore be refused when during the fitting of the z-position of the checkpoints with one plane the z-position of individual checkpoints show that these checkpoints are spaced at least at a threshold value from the plane. Alternatively or in addition, the z-distance that individual checkpoints have from the fitted plane or a measure calculated from the distances of several checkpoints can be used as the basis for a quality statement on the workpiece 2 before or after its machining with direct laser beam writing.

Direct laser beam writing can occur principally in two types of structuring. In the first variant, the structuring can occur in such a way that exposure occurs at fixed lateral position with movement in the axial direction. This structuring is known as so-called axial scan. After the complete exposure over the desired depth of the workpiece, the next lateral point is accessed and then the same axial shift occurs. Preferably, the position of the focus in relation to the boundary surface is checked before the next axial scan after the lateral movement.

Alternatively, the structuring can occur at a given axial position by lateral displacement, which is why this mode is also known as lateral scan. The position of the boundary surface can be determined irrespective of the axial position at chosen lateral points which can be identical with the mentioned checkpoints (but need not be). Advantageously, a new referencing in relation to the boundary surface position can be determined in each plane per fit with a planar surface and be considered for the scan in this or the next depth.

The described arrangement or described method therefore allows compensating displacements during the direct laser beam writing or performing a check of the boundary surface position, i.e. the position of the surface of the workpiece. It is obvious that a termination of the writing process occurs in the case of an excessively strong off-position.

The apparatus in accordance with the invention can therefore perform the following steps in operation, controlled by the microscope control unit 18:

A calibration of the z-drive 41 and the longitudinal adjusting mechanism (if any) and the optional (x,y,z) actuator can be done on the basis of the described fluorescent sample calibration run.

In a so-called pre-scan, the boundary surface can be scanned at different checkpoints with the autofocus device and the z-positions of the checkpoints being determined. A plane is modeled from these z-positions in order to determine the precise position of the boundary surface between the workpiece 2 and the cover glass, i.e. the plane of the surface of the workpiece 2. If there is too much distance from the fitted plane for individual checkpoints, the workpiece 2 can either be rejected as being insufficient or can be provided with a respective quality parameter which indicates a warping. For such an action it is obviously possible to use not only a single checkpoint, but also a suitable measure which links the z-deviations of all checkpoints in a suitable way.

The focus of the machining laser beam 14 is placed on the boundary surface as the next step and the writing step is started.

In the case of the axial scan, the desired laser beam shift is made in a plane perpendicular to the boundary surface. Insofar as the entire three-dimensional volume has not yet been processed, there is a lateral shift after each plane, i.e. a new point on the boundary surface is accessed. It can optionally be checked by means of the autofocus whether this point actually lies on the boundary surface, and if necessary a correction will be made. This correction can also occur in such a way that a reference is made to a tilting determined during the pre-scan or (if a fit with curves instead of planes was made) or to a warping of the workpiece 2. For this new lateral point there is again a scanning perpendicular to the sample surface/boundary surface. The next plane is therefore processed.

In the case of a lateral scan, the writing process occurs in a plane parallel to the boundary surface. Once this plane is processed, a new axial position is accessed, for which a plane can be modeled by reference to the previously determined boundary surface.

The machining process is completed once the sample has been processed completely by the axial scan or lateral scan.

The following applies to all embodiments or operating modes of the microscope 1 with autofocus device:

The mentioned modifications concerning catch range or adjustment of the positioning precision can obviously be used not only in the configuration of FIG. 7, but also in all embodiments.

In order to produce the lowest possible influences by structured illumination during online tracking, i.e. the image of the modulation object, a strip pattern can be projected onto the sample as a modulation object which is displaced laterally in an alternating manner in rapid sequence (>30 Hz). In the case of two positions this would be a phase shift by 180°, and in three positions a phase shift by 120°. The grating structure (i.e. grating constant, duty cycle) can be adjusted so easily in triggering when using an electronic light modulator that homogeneous illumination is obtained on a temporal average. The adjustment of the optimal grating structure to the respectively used objective 20 or its NA or magnification is also possible.

It is a further advantage of an adjustable, especially controllable, light modulator 28 and thus a variable autofocus illumination structure that after finding the boundary surface only the interesting areas of the object field are illuminated. The image contrast for the tracking apparatus can be increased, optionally also for the normal detection channel.

In all variants of the autofocus and tracking systems, a computational control and evaluation device (e.g. a computer) is used which performs the signal analysis and the control of the actuators (z-drive, (x,y,z) table, filter, etc.). Evaluation and control can be implemented by means of firmware or software. This control and evaluation device performs the entire sequence control as explained here.

Instead of adjustable, e.g. electrically switchable, light modulators (e.g. LCD, DMD), it is also possible to use static light modulators (transmission or phase gratings). The projected modulation object can be displaceable on the sample side using tiltable planar plates or other apparatuses. An exchange of the grating is also possible in conjunction to achieve a variation of the grating constant or structure. As already explained, a planar grating structure can also be used which has several different grating periods, e.g. two to ten adjacently arranged strip gratings with different grating frequencies. This shows by way of example that the light modulator can also be line-shaped and does not necessarily has to be two-dimensional.

Since the autofocus method in accordance with the invention preferably works with planar (two-dimensional) cameras, noise suppression can be done by evaluating several lines or, in the case of several grating lines, the best suitable grating can be chosen for each application by reading out the respective camera lines, without having to make any mechanical changes (e.g. exchange of grating). Principally, light modulators 28 that stand perpendicularly to the optical axis can be implemented more easily as transmission modulators, whereas inclined light modulators 28 are easier to realize as reflection modulators. If very small objects are to be detected by the tracking system, then it a sufficiently high-frequency illumination modulation may no longer be possible. In this case it is also possible to illuminate in a spatially non-modulated manner and to evaluate only the intensity of the scattered or reflected signals. In addition to CCD cameras, CMOS and all other types of digital cameras can be considered as spatially resolving detectors.

The autofocus device shall automatically focus a specific region of the sample or hold the same in the focal plane of the object. An offset (typically 0 . . . 1000 µm) can be predetermined for this purpose between boundary surface and relevant workpiece plane. If this offset is varied in steps, the workpiece is machined three-dimensionally, as already explained, in an always defined and controlled distance to the boundary surface.

Insofar as method steps or special operating modes are described in this description, they are realized by a control device belonging to the autofocus device, e.g. by the control device 18.

In order to enable measurement with the autofocus device as far as possible into the sample, the camera 15 can be arranged asymmetrically in relation to the respective optical axis (e.g. optical axis OA2 in FIG. 7), so that an asymmetrical catch range is obtained. For example, the contrast maximum can lie initially close to an edge of the catch range when a boundary surface coincides with the set focal plane of the objective 20. The other edge of the catch rane then corresponds to the maximum distance of the boundary surface to the set focal plane in which the focus can still be fixed, i.e. the maximum holding area.

Depending on the magnification of the objective, a catch and holding range of 10 µm to 10 mm can be achieved. The resolution in the z-plane is 5 nm to 5 µm depending on the magnification or numerical aperture of the objective. The z-resolution is always five times better than the depth of focus of the used objective 20.

The invention claimed is:

1. A method for laser beam machining of a workpiece, comprising:
    focusing a laser beam to a focal point by an objective, which has a focal plane, into or onto the workpiece to produce a machining effect by two-photon processes, the work piece having a boundary surface;
    shifting the position of the focal point with respect to the workpiece;
    projecting an illuminating modulation object to the workpiece and into the focal plane or so as to intersect the focal plane to obtain a reference for the position of the focal point;

imaging reflections of the projection occurring at a boundary surface into an autofocus image plane;

detecting the imaged reflections by a camera having a camera image plane, wherein the camera image plane either intersects the autofocus image plane when the projection of the illuminating modulation object lies in the focal plane, or lies in the autofocus image plane when the projection of the modulation object intersects the focal plane.

2. The method according to claim 1, further comprising placing a cover glass over the workpiece and using the interface between workpiece and the cover glass as the boundary surface.

3. The method according to claim 1, further comprising selecting the modulation object to emit light in a spectral range which differs from that of the laser beam and filtering out the spectral range of the laser beam at detection.

4. The method according to claim 1, further comprising determining the position of the boundary surface at least intermittently during the laser beam machining and using the position of the boundary surface as a reference for setting the position of the focus.

5. The method according to claim 1, further comprising determining the position of the boundary surface at different lateral points before the laser beam machining and modeling the position of the boundary surface by a plane to determine the position of the full boundary surface more precisely.

6. The method according to claim 5, further comprising determining a measure of a deviation of the boundary surface from an ideal plane from a distance of the position of the lateral points from the modeled plane; and
assigning the workpiece a quality parameter based on the measure, and suppressing further machining of the workpiece if the measure is in a specific quality parameter range.

7. The method according to claim 1, further comprising machining the workpiece such that that the position of the focal point is shifted three-dimensionally, shifting the focal point in planes and processing each plane completely prior to successively processing a next plane;
selecting the planes to be either parallel or perpendicular to the boundary surface, and
referencing the boundary surface once for each plane.

8. The method according to claim 1, further comprising using a fluorescent fluid for autofocus calibration.

9. A microscope for laser machining a workpiece by two-photon processes, comprising:
an objective which has a focal plane disposed in a workpiece space;
a machining laser beam source which emits machining laser radiation which the objective focuses in the workpiece space;
an autofocus device including a light modulator for generating an illuminating, intensity-modulated modulation object;
autofocus optics which, in combination with the objective, project the luminating modulation object into the focal plane or into a plane intersecting the focal plane such that a projected image of the modulation object is produced in the workpiece space; and
a camera that captures a two-dimensional picture, comprising a camera image plane and autofocus imaging optics which together with the objective image the projected image of the modulation object disposed in the workpiece space into an autofocus image plane;
wherein the camera image plane either intersects the autofocus image plane when the image of the illuminating modulation object lies in the focal plane, or lies in the autofocus image plane when the image of the modulation object intersects the focal plane.

10. The microscope according to claim 9, wherein the light modulator is controllable and is controlled to produce a spatially or temporally intensity-modulated modulation object and wherein the camera detects the contrast of temporal modulation when the temporally intensity modulated modulation occurs.

11. The microscope according to claim 10, wherein the light modulator comprises an illuminated LCD or DMD element or at least one periodic structure.

12. The microscope according to claim 10, wherein the light modulator comprises at least one periodic structure and the at least one periodic structure comprises a strip grating structure or several different strip structures.

13. The microscope according to claim 9, wherein the projection of the modulation object is reflected via a beam splitter into the microscope beam path.

14. The microscope according to claim 9, wherein the autofocus imaging optics comprise at least one filter which suppresses or filters out spectral components of the machining laser radiation.

15. The microscope according to claim 9, wherein the autofocus imaging optics comprise optics arranged upstream of the camera and that image the projection of the modulation object with an intermediate image onto the camera.

16. The microscope according claim 9, further comprising a longitudinal adjusting mechanism that adjusts a distance between the camera and the autofocus imaging optics, with the longitudinal adjusting mechanism including a position feedback which indicates the adjusting path via a path signal.

17. The microscope according claim 9 further comprising a control device that receives an angle signal and sets the autofocus resolution by triggering an angle adjusting mechanism.

18. The microscope according to claim 9, further comprising a control unit that
controls the objective to focus a laser beam to produce a machining effect by two-photon processes, the workpiece having a boundary surface; and
controls shifting the position of the focal point with respect to the workpiece;
wherein the objective projects a luminating modulation object to the workpiece and into the focal plane or to intersect the focal plane to obtain a reference for the position of the focal point; and
wherein the objective images reflections of the projection occurring at the boundary surface into an autofocus image plane.

19. The microscope according to claim 9, further comprising a cover glass over the workpiece and wherein the interface between workpiece the cover glass is used as the boundary surface.

20. The microscope according to claim 9, wherein the modulation object emits light in a spectral range which differs from that of the laser beam and the spectral range of the laser beam is filtered out at detection.

21. The microscope according to claim 18, wherein the control unit determines the position of the boundary surface at least intermittently during the laser beam machining and uses the position of the boundary surface as a reference for setting the position of the focus.

22. The microscope according to claim 18, wherein the control unit determines the position of the boundary surface at different lateral points before the laser beam machining and models the position of the boundary surface by a plane to determine the position of the full boundary surface more precisely.

23. The microscope according to claim 22, wherein the control unit determines a measure of a deviation of the boundary surface from an ideal plane from a distance of the position of the lateral points from the modeled plane; and the control unit assigns the workpiece a quality parameter based on the measure, and suppresses further machining of the workpiece if the measure is in a specific quality parameter range.

24. The microscope according to claim 9, further comprising a control unit that controls machining of the workpiece such that that the position of the focal point is shifted three-dimensionally, and the control unit shifts the focal point in planes and controls the processing of each plane such that a first plane is processed completely prior to processing a next plane and the control unit controls selection of the planes to be either parallel or perpendicular to the boundary surface, and the control unit controls referencing of the boundary surface once for each plane.

25. The microscope according to claim 9, further comprising a fluorescent fluid used for autofocus calibration.

* * * * *

UNITED STATES PATENT AND TRADEMARK OFFICE
CERTIFICATE OF CORRECTION

| | |
|---|---|
| PATENT NO. | : 8,389,893 B2 |
| APPLICATION NO. | : 12/744216 |
| DATED | : March 5, 2013 |
| INVENTOR(S) | : Michael Kempe et al. |

It is certified that error appears in the above-identified patent and that said Letters Patent is hereby corrected as shown below:

In the Specifications:

Column 12, line 10:

"... reflectivity for the for the long-wave ..."

should read

--... reflectivity for the long-wave ...--

Column 15, lines 37-38:

"...that can be still be evaluated..."

should read

--... that can still be evaluated ...--

In the Claims:

Column 20, line 18:

"... then it a sufficiently high frequency ..."

should read

--... then a sufficiently high frequency ...--

Column 21, line 37:

"... the workpiece such that that the position ..."

should read

--... the workpiece such that the position ...--

Column 24, line 1:

"... such that that the position ..."

should read

--such that the position ...--

Signed and Sealed this
Ninth Day of July, 2013

Teresa Stanek Rea
*Acting Director of the United States Patent and Trademark Office*